(12) United States Patent
Kim et al.

(10) Patent No.: US 10,151,022 B2
(45) Date of Patent: *Dec. 11, 2018

(54) MASK ASSEMBLY FOR TESTING A DEPOSITION PROCESS, DEPOSITION APPARATUS INCLUDING THE MASK ASSEMBLY, AND TESTING METHOD FOR A DEPOSITION PROCESS USING THE MASK ASSEMBLY

(71) Applicant: Samsung Display Co., Ltd., Yongin-si, Gyeonggi-do (KR)

(72) Inventors: Min Ho Kim, Hwaseong-si (KR); You Min Cha, Asan-si (KR); Seuk Hwan Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/722,987

(22) Filed: Oct. 2, 2017

(65) Prior Publication Data

US 2018/0021802 A1    Jan. 25, 2018

Related U.S. Application Data

(63) Continuation of application No. 13/794,701, filed on Mar. 11, 2013, now Pat. No. 9,795,983.

(30) Foreign Application Priority Data

Sep. 4, 2012    (KR) .......................... 10-2012-0097799

(51) Int. Cl.
   *C23C 14/04*    (2006.01)
   *C23C 14/46*    (2006.01)
   (Continued)

(52) U.S. Cl.
   CPC .............. *C23C 14/042* (2013.01); *B05C 3/20* (2013.01); *C23C 14/46* (2013.01); *C23C 14/52* (2013.01); *C23C 14/542* (2013.01); *C23C 14/568* (2013.01)

(58) Field of Classification Search
   CPC ..... C23C 14/042; C23C 14/04; C23C 14/044; C23C 8/04; C23C 10/04; C23C 16/04;
   (Continued)

(56) References Cited

U.S. PATENT DOCUMENTS 3,513,808 A    5/1970    Mortimer et al.
4,096,821 A    6/1978    Greeneich et al.
(Continued)

FOREIGN PATENT DOCUMENTS

CN    1369900 A    9/2002
CN    101803459 A    8/2010
(Continued)

OTHER PUBLICATIONS

Korean Patent Abstracts Publication No. KR 10-2008-0002188 A, dated Jan. 4, 2008 for KR 10-0806840 A, 1 page.

*Primary Examiner* — Aiden Lee
(74) *Attorney, Agent, or Firm* — Lewis Roca Rothgerber Christie LLP

(57) ABSTRACT

A deposition apparatus includes deposition sources, a deposition chamber, a mask assembly, and a transfer unit. The mask assembly includes a support member, a shutter member, and a drive member. The support member has a first opening configured to allow the deposition materials to pass through while supporting the base substrate on which the passed-through deposition materials are deposited. The shutter member is accommodated in the support member and has a second opening smaller than the first opening. The drive member is configured to change a position of the second (Continued)

opening with respect to the base substrate in accordance with the movement of the mask assembly.

7 Claims, 17 Drawing Sheets

(51) Int. Cl.
*C23C 14/52* (2006.01)
*C23C 14/54* (2006.01)
*C23C 14/56* (2006.01)
*B05C 3/20* (2006.01)

(58) Field of Classification Search
CPC ....... C23C 16/042; C23C 18/06; C30B 25/04; H01L 51/0011
See application file for complete search history.

(56) References Cited

U.S. PATENT DOCUMENTS

| | | | |
|---|---|---|---|
| 6,045,671 A | 4/2000 | Wu et al. | |
| 6,627,332 B2 | 9/2003 | Utsugi et al. | |
| 7,629,025 B2 | 12/2009 | Yamazaki et al. | |
| 8,313,806 B2 | 11/2012 | Matsuura | |
| 2002/0078892 A1 | 6/2002 | Takahashi | |
| 2002/0139303 A1 | 10/2002 | Yamazaki et al. | |
| 2002/0179013 A1 | 12/2002 | Kido et al. | |
| 2005/0239294 A1 | 10/2005 | Rosenblum et al. | |
| 2006/0174829 A1 | 8/2006 | An et al. | |
| 2007/0009652 A1 | 1/2007 | Manz et al. | |
| 2007/0266943 A1 | 11/2007 | Yeh et al. | |
| 2009/0200833 A1 | 8/2009 | Heuel et al. | |
| 2010/0170439 A1 | 7/2010 | Negishi | |

FOREIGN PATENT DOCUMENTS

| | | |
|---|---|---|
| EP | 2 056 381 A1 | 5/2009 |
| JP | 2001-296819 | 10/2001 |
| JP | 2004-247113 | 9/2004 |
| JP | 2006-330411 | 12/2006 |
| JP | 2008-261058 | 10/2008 |
| JP | 2009-019243 | 1/2009 |
| JP | 2009-087931 | 4/2009 |
| KR | 10-2006-0061662 A | 6/2006 |
| KR | 10-0806840 A | 2/2008 |
| TW | 200536005 | 11/2005 |
| TW | I281735 B | 5/2007 |
| TW | I319201 B | 1/2010 |
| WO | WO 2004/032191 A2 | 4/2004 |

MASK ASSEMBLY FOR TESTING A DEPOSITION PROCESS, DEPOSITION APPARATUS INCLUDING THE MASK ASSEMBLY, AND TESTING METHOD FOR A DEPOSITION PROCESS USING THE MASK ASSEMBLY

CROSS-REFERENCE TO RELATED APPLICATION

This application is a continuation of U.S. patent application Ser. No. 13/794,701, filed Mar. 11, 2013, which claims priority to and the benefit of Korean Patent Application No. 10-2012-0097799, filed on Sep. 4, 2012, the entire contents of both of which are incorporated herein by reference.

BACKGROUND

1. Field

Aspects of embodiments of the present invention relate to a mask assembly for testing a deposition process, a deposition apparatus including the mask assembly, and a testing method for a deposition process using the mask assembly.

2. Description of Related Art

A flat panel display or a semiconductor device may be manufactured by depositing organic or inorganic materials on a base substrate. To this end, a deposition process may be performed in a deposition apparatus. The deposition apparatus may include a vacuum chamber, at least one deposition source in the vacuum chamber, a mask, and a transfer unit that transfers the base substrate. A testing of the deposition process may be performed to assess whether the deposition process (as performed in the deposition apparatus) is appropriate before performing the deposition process to manufacture the flat panel display or the semiconductor device. A test substrate may be used to test the deposition process. For example, the thickness and uniformity of the deposited material may be measured on the test substrate as part of the testing of the deposition process. To this end, the measured thickness and uniformity may be compared to a reference thickness and uniformity.

When testing the deposition process for a deposition apparatus having multiple deposition sources, each for depositing a different material, multiple test substrates may be needed. For example, the test substrates may be sequentially loaded into the deposition apparatus and the different materials respectively deposited on the different test substrates. The thickness and uniformity of each of the deposition materials deposited on the respective test substrates may then be measured.

SUMMARY

Embodiments of the present invention provide for a mask assembly capable of testing a deposition process using one test substrate for a plurality of deposition sources. Further embodiments provide for a deposition apparatus including the mask assembly, and for a testing method for a deposition process using the mask assembly.

According to an exemplary embodiment of the present invention, a mask assembly for testing a deposition process is provided. The mask assembly includes a support member having a first opening configured to allow deposition materials to pass through while supporting a base substrate on which the passed-through deposition materials are deposited while the mask assembly moves in a first direction, a shutter member accommodated in the support member and having a second opening smaller than the first opening, and a drive member configured to move the shutter member in accordance with the movement of the mask assembly to change a position of the second opening with respect to the base substrate.

The support member may include a bottom portion having the first opening, and a sidewall bent from the bottom portion to support the base substrate.

The shutter member may be configured to move with respect to the base substrate in a direction opposite to the first direction in accordance with the movement of the mask assembly.

The second opening may extend in a second direction substantially perpendicular to the first direction.

The shutter member may have a larger area than the first opening and may be located on the bottom portion.

The mask assembly may further include a rail unit located on the bottom portion, and a coupling unit coupled to the shutter member and inserted into the rail unit to allow the shutter member to move along the rail unit.

The drive member may be configured to rotate in accordance with the movement of the mask assembly. The shutter member may be configured to move in accordance with the rotation of the drive member.

The drive member may include a first pinion configured to rotate by a frictional force.

The drive member may further include a second pinion configured to receive a motive power from the first pinion and to make contact with a side surface of the shutter member.

The shutter member may include sawteeth on the side surface of the shutter member and configured to engage sawteeth of the second pinion.

The drive member may include an N-polar portion and an S-polar portion that are alternately arranged, and may be configured to rotate by a magnetic force.

According to another exemplary embodiment of the present invention, a mask assembly for testing a deposition process is provided. The mask assembly includes a support member having a first opening configured to pass through deposition materials while supporting a base substrate on which the passed-through deposition materials are deposited while the mask assembly moves, a shutter member accommodated in the support member and including a rotatable member having a second opening smaller than the first opening, and a drive member configured to rotate the rotatable member in accordance with the movement of the mask assembly to change a position of the second opening with respect to the base substrate.

The support member may include a bottom portion having the first opening, and a sidewall bent from the bottom portion to support the base substrate.

The shutter member may further include a rotation axis coupled to the rotatable member to rotate the rotatable member.

The first opening may include a left first opening and a right first opening. The shutter member may include a left shutter member overlapping the left first opening and a right shutter member overlapping the right first opening.

The drive member may include a first drive member configured to rotate in a first direction and a second drive member configured to rotate in a second direction that is opposite to the first direction in accordance with the movement of the support member. The position of the second opening of the rotatable member of the left shutter member with respect to the base substrate may be configured to change by the rotation of the first drive member. The position of the second opening of the rotatable member of the right shutter member with respect to the base substrate may be configured to change by the rotation of the second drive member.

Each of the first drive member and the second drive member may include a first pinion configured to rotate by a frictional force.

Each of the first and second drive members may further include a second pinion configured to receive a motive power from the first pinion and to make contact with a side surface of the shutter member.

Each of the first and second drive members may include a discus-shaped magnetic member including an N-polar portion and an S-polar portion that are alternately arranged. The magnetic member may be configured to rotate by a magnetic force.

According to yet another exemplary embodiment of the present invention, a deposition apparatus is provided. The deposition apparatus includes: a plurality of deposition sources configured to deposit deposition materials; a deposition chamber accommodating the deposition sources; a mask assembly for testing a deposition process, the mask assembly being configured to couple to a base substrate while moving through the deposition chamber while the deposition sources deposit the deposition materials on the base substrate; and a transfer unit configured to move the mask assembly through the deposition chamber. The mask assembly includes a support member having a first opening configured to allow the deposition materials to pass through while supporting the base substrate on which the passed-through deposition materials are deposited, a shutter member accommodated in the support member and having a second opening smaller than the first opening, and a drive member configured to change a position of the second opening with respect to the base substrate in accordance with the movement of the mask assembly.

The transfer unit may include a plurality of rollers configured to move the mask assembly through the deposition chamber.

The drive member may be configured to rotate in accordance with the movement of the mask assembly. The position of the second opening may be configured to change by the rotation of the drive member.

The deposition chamber may include a loading area configured to couple the base substrate to the mask assembly, a deposition area in which the deposition sources are accommodated, and an unloading area configured to decouple the base substrate from the mask assembly.

The drive member may include a plurality of pinions. One of the pinions may be configured to contact a side surface of the shutter member to change the position of the second opening with respect to the base substrate.

The deposition chamber may include a plurality of transfer racks on a sidewall of the deposition area to correspond to the deposition sources or to spaces between the deposition sources.

Another one of the pinions may be configured to contact the transfer racks to change the position of the second opening with respect to the base substrate.

The deposition apparatus may further include a return unit configured to return the mask assembly to the loading area from the unloading area, and a return chamber accommodating the return unit.

The return chamber may include a return rack on a sidewall of the return chamber.

The drive member may include a discus-shaped magnetic member including an N-polar portion and an S-polar portion that are alternately arranged. The deposition chamber may include a plurality of magnetic transfer members, each including an N-polar portion and an S-polar portion that are alternately arranged, on a sidewall of the deposition area to correspond to the deposition sources.

The support member may include a bottom portion having the first opening, and a sidewall bent from the bottom portion to support the base substrate.

The shutter member may be configured to move with respect to the base substrate in a direction opposite to a direction in which the mask assembly moves, in accordance with the movement of the mask assembly.

The shutter member may include a rotatable member configured to rotate by the movement of the mask assembly.

According to still yet another exemplary embodiment of the present invention, a testing method for a deposition process using a mask assembly is provided. The testing method includes: entering the mask assembly into a deposition area of a deposition chamber accommodating a plurality of deposition sources, the mask assembly including a support member supporting a base substrate and a shutter member having an opening; depositing a respective plurality of deposition materials from the plurality of deposition sources onto the base substrate; moving the mask assembly through the deposition area; and changing a position of the opening of the shutter member with respect to the base substrate in accordance with the movement of the mask assembly.

The testing method may further include: exiting the mask assembly from the deposition area, and returning the mask assembly to an entrance of the deposition area from an exit of the deposition area.

The changing of the position of the opening of the shutter member may include moving the shutter member with respect to the base substrate in a direction opposite to a direction in which the mask assembly moves.

The changing of the position of the opening of the shutter member may include rotating the shutter member in accordance with the movement of the mask assembly.

The plurality of deposition materials may include a corresponding plurality of different deposition materials.

According to the above and other embodiments, the mask assembly uses one test substrate to test the deposition process of the deposition apparatus having multiple deposition sources supplying a corresponding multiple deposition materials. The mask assembly receives the respective deposition materials in different areas of the test substrate. Since the number of test substrates needed to test the deposition process may be reduced, testing costs may be reduced and the time needed to test the deposition process may be shortened.

According to the above and other embodiments, in the deposition apparatus, the position of the second opening of the shutter member with respect to the test substrate is changed in accordance with the movement of the mask assembly. The position of the second opening is changed for each deposition source. Thus, the deposition materials are deposited in different areas of the test substrate.

BRIEF DESCRIPTION OF THE DRAWINGS

The above and other aspects and features of the present invention will become readily apparent by reference to the following detailed description when considered in conjunction with the accompanying drawings wherein.

DETAILED DESCRIPTION

Figure 1:
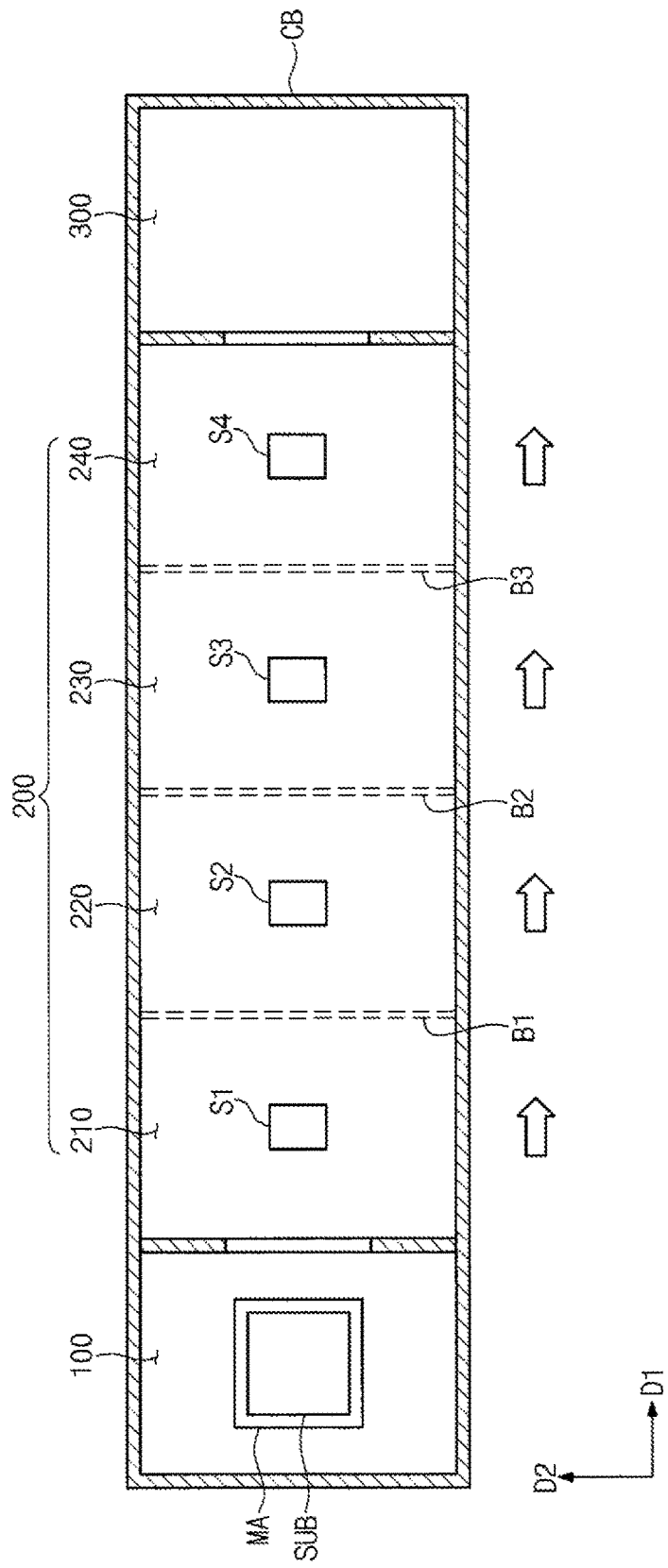
FIG. 1 is a plan view showing a deposition apparatus according to an exemplary embodiment of the present invention.

It will be understood that when an element or layer is referred to as being "on," "connected to," or "coupled to" another element or layer, it can be directly on, connected to, or coupled to the other element, or one or more intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an," and "the" are intended to include the plural forms as well, unless the context clearly indicates otherwise. It will be further understood that the terms "includes," "comprises," "comprising," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, the present invention will be explained in detail with reference to the accompanying drawings.

Figure 2:
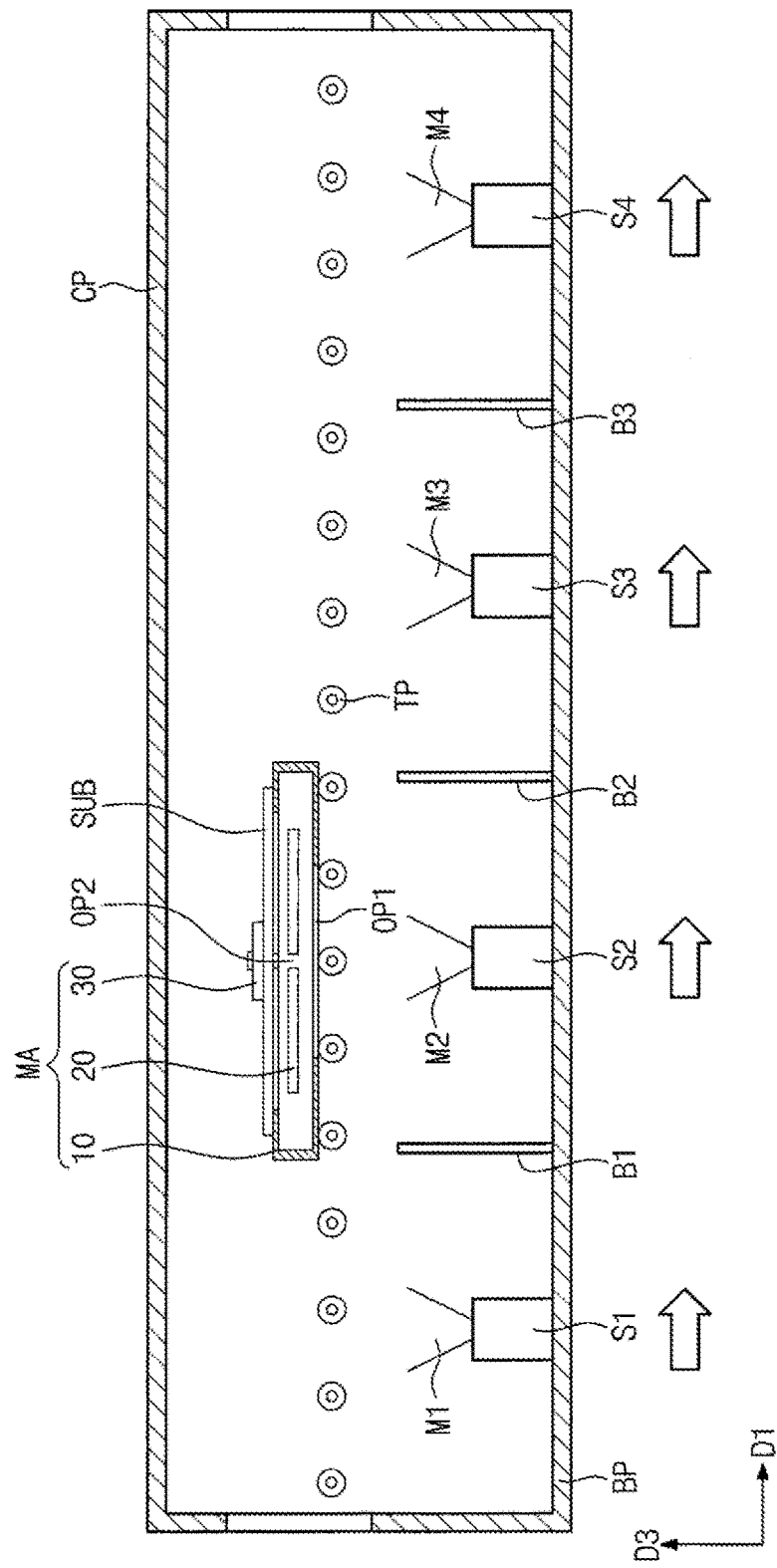
FIG. 2 is a first cross-sectional view showing a portion of the deposition apparatus shown in FIG. 1 according to an exemplary embodiment of the present invention.
Figure 3:
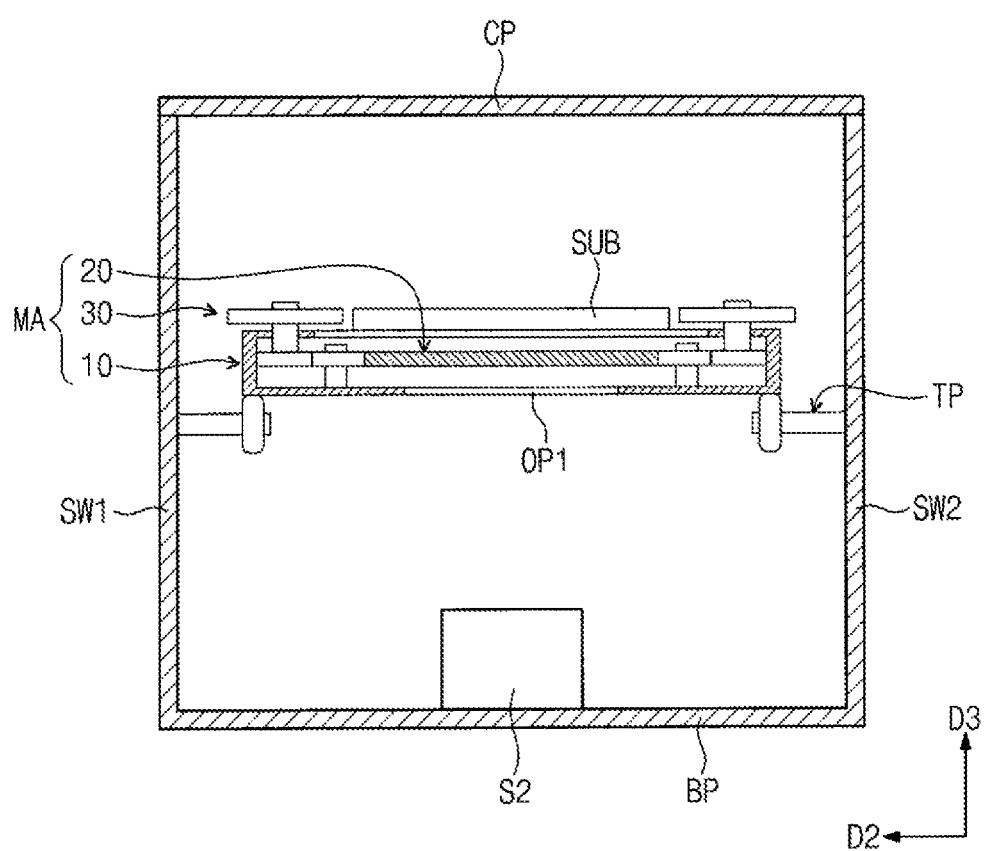
FIG. 3 is a second cross-sectional view showing a portion of the deposition apparatus shown in FIGS. 1-2.

FIG. 1 is a plan view showing a deposition apparatus according to an exemplary embodiment of the present invention. FIG. 2 is a first cross-sectional view showing a portion of the deposition apparatus shown in FIG. 1 according to an exemplary embodiment of the present invention. FIG. 3 is a second cross-sectional view showing a portion of the deposition apparatus shown in FIGS. 1-2.

Referring to FIGS. 1 to 3, a deposition apparatus includes a deposition chamber CB, a plurality of deposition sources S1 to S4, a mask assembly MA for testing a deposition process, and a transfer unit TP. FIGS. 1 to 3 show four deposition sources S1 to S4 as an example.

The deposition chamber CB has a shape elongated in a first direction D1 in which a deposition process is performed. The deposition chamber CB includes a first sidewall SW1, a second sidewall SW2 facing the first sidewall SW1 in a second direction D2 substantially perpendicular to the first direction D1, a bottom portion BP connected between the first sidewall SW1 and the second sidewall SW2, and a ceiling portion CP. The bottom portion BP faces the ceiling portion CP in a third direction D3 substantially perpendicular to the first direction D1 and the second direction D2.

The deposition chamber CB is divided into a plurality of areas according to functions. The deposition chamber CB includes a loading area 100, a deposition area 200, and an unloading area 300.

A base substrate SUB is loaded onto or coupled to the mask assembly MA in the loading area 100. The base substrate SUB may be a test substrate for testing whether a deposition process is appropriate to manufacture a display panel or other semiconductor device before the display panel or semiconductor device is manufactured using the deposition process. A substrate intended for manufacturing the display panel or semiconductor device may be used as the base substrate SUB. For instance, the substrate may be for a display panel that may be for, but not limited to, an organic light emitting diode display panel. The base substrate SUB may include, for example, glass, silicon, metal, or plastic.

The deposition sources S1 to S4 are disposed (for example, accommodated) in the deposition area 200. The deposition sources S1 to S4 are spaced apart from each other along the first direction D1. In other embodiments, the number and arrangement of deposition sources may vary from those shown in FIGS. 1-3.

The deposition sources S1 to S4 may respectively provide different deposition materials M1 to M4. The deposition sources S1 to S4 may, for example, provide organic materials and/or inorganic materials. Each of the deposition sources S1 to S4 may include a container to accommodate the respective deposition materials M1 to M4 and a heating unit to evaporate the deposition materials M1 to M4.

The deposition area 200 is divided into a plurality of individual deposition areas 210 to 240. The deposition sources S1 to S4 are respectively accommodated in the individual deposition areas 210 to 240. The individual deposition areas 210 to 240 are partitioned by a plurality of partition walls B1 to B3.

The base substrate SUB is unloaded or decoupled from the mask assembly MA in the unloading area 300. Doors may be installed between the loading area 100 and the deposition area 200 (for example, at an entrance of the deposition area) and between the deposition area 200 and the unloading area 300 (for example, at an exit of the deposition area). In addition, pressures in the loading area 100, the deposition area 200, and the unloading area 300 may be different from each other. Depending on the deposition process, the deposition area 200 may need to be maintained in a vacuum state.

The mask assembly MA into which the base substrate SUB is loaded or coupled passes through the deposition chamber CB including the deposition area 200. The mask assembly MA is transferred (for example, moved from one end of the deposition area 200 to the other) by the transfer unit TP. The mask assembly MA includes a support member 10, a shutter member 20, and a drive member 30. The support member 10 includes a first opening OP1, through which the deposition materials M1 to M4 enter or pass through from the deposition sources S1 to S4, and supports the base substrate SUB.

The shutter member 20 is accommodated in the support member 10. The shutter member 20 includes a second opening OP2 smaller than the first opening OP1. The deposition materials M1 to M4 passing through the first opening OP1 are deposited on the base substrate SUB after passing through the second opening OP2.

The drive member 30 changes a position of the second opening OP2 with respect to the base substrate SUB in accordance with the movement of the mask assembly MA. For example, the position of the second opening OP2 with respect to the base substrate SUB when the mask assembly MA is over the first deposition source S1 may be different from the position of the second opening OP2 with respect to the base substrate SUB when the mask assembly MA is over the fourth deposition source S4.

The transfer unit TP includes a plurality of rollers. The rollers are installed on the first sidewall SW1 and the second sidewall SW2. The rollers make contact with the support member 10. The support member 10 moves in the first direction D1 according to the rotation of the rollers. The rollers may be operated by a motor disposed on the outside of the deposition chamber CB. The operation of the rollers may be controlled by turning on and off the motor. The transfer unit TP is not limited to the rollers or to this implementation of the rollers. In other embodiments, the transfer unit TP may include different transfer devices, such as a conveyor belt, instead of the rollers.

Figure 4A:
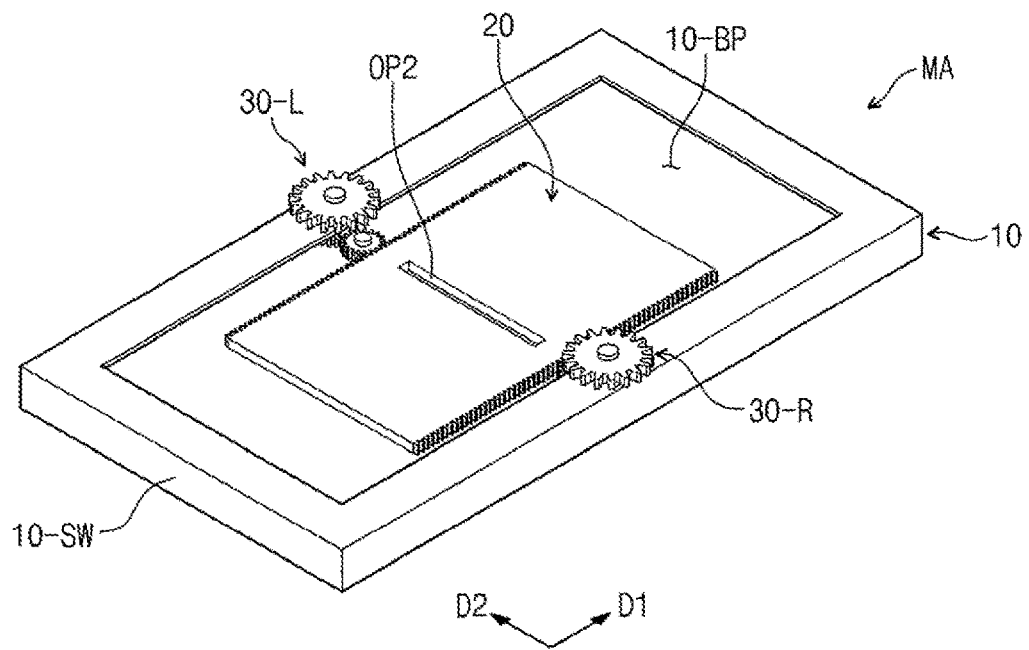
FIG. 4A is a perspective view showing a mask assembly used to test a deposition process according to an exemplary embodiment of the present invention.
Figure 4B:
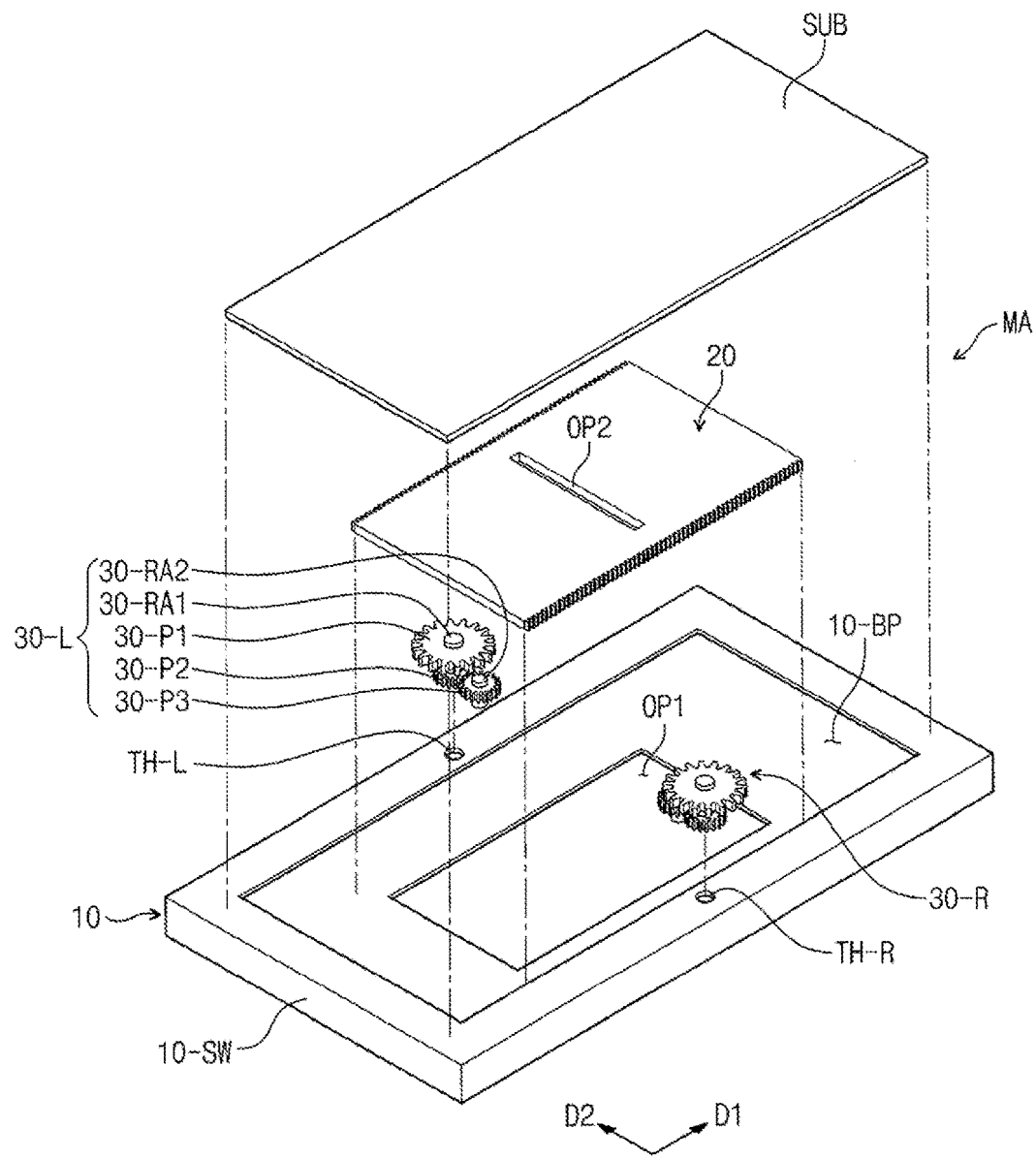
FIG. 4B is an exploded perspective view showing the mask assembly of FIG. 4A.

FIG. 4A is a perspective view showing a mask assembly MA used to test a deposition process according to an exemplary embodiment of the present invention. FIG. 4B is an exploded perspective view showing the mask assembly MA of FIG. 4A.

Referring to FIGS. 4A and 4B, the support member 10 includes a bottom portion 10-BP and sidewalls 10-SW. The first opening OP1 is formed through the bottom portion 10-BP. The sidewalls 10-SW are bent from the bottom portion 10-BP. The bottom portion 10-BP has a rectangular shape when viewed in a plan view. The sidewalls 10-SW are bent from each of the four sides of the bottom portion 10-BP having the rectangular shape. The sidewalls 10-SW include vertical portions connected to the four sides of the bottom portion 10-BP and horizontal portions connected to the vertical portions and contacting the base substrate SUB.

The shutter member 20 is disposed on the bottom portion 10-BP to overlap the first opening OP1. The shutter member 20 is surrounded by the sidewalls 10-SW and has a rectangular shape. The shutter member 20 has a larger area than the first opening OP1.

The second opening OP2 is elongated in the second direction D2 substantially perpendicular to the first direction D1. For instance, the second opening OP2 may be a slit having a length in the second direction D2 longer than a width in the first direction D1.

The drive member 30 (see FIG. 3) may be rotated in accordance with the movement of the mask assembly MA. The rotational force of the drive member 30 is delivered to the shutter member 20 and the shutter member 20 moves by the rotational force. A motive power source that causes the rotation of the drive member 30 may be, but not limited to, a mechanical member, e.g., a motor, friction with an outside member (for example, a frictional force), etc.

As shown in FIGS. 4A and 4B, the drive member 30 includes first and second rotation members 30-L and 30-R configured to rotate in opposite directions. The first and second rotation members 30-L and 30-R are disposed on opposing ones of the sidewalls 10-SW facing each other in the second direction D2. The present invention is not limited thereto, and in other embodiments, one of the first or second rotation member 30-L or 30-R may not be present.

Each of the first and second rotation members 30-L and 30-R includes a first pinion 30-P1, a second pinion 30-P2, a third pinion 30-P3, a first rotation axis 30-RA1, and a second rotation axis 30-RA2. The first pinion 30-P1 receives a motive power from an external source.

The first rotation axis 30-RA1 connects the first pinion 30-P1 to the second pinion 30-P2 to transfer the motive power from the first pinion 30-P1 to the second pinion 30-P2. The first rotation axes 30-RA1 of the first and second rotation members 30-L and 30-R are inserted into thru-holes TH-L and TH-R formed through the sidewalls 10-SW facing each other in the second direction D2.

The third pinion 30-P3 is coupled to (for example, engaged with) the second pinion 30-P2 to receive the motive power from the second pinion 30-P2. The third pinion 30-P3 moves the shutter member 20 using the motive power from the second pinion 30-P2. The second rotation axis 30-RA2 connected to the third pinion 30-P3 is fixed to the bottom portion 10-BP.

In other embodiments, the first, second, and third pinions 30-P1, 30-P2, and 30-P3 of each of the first and second rotation members 30-L and 30-R may be replaced with a discus-shaped rotation member that does not have a sawtooth pattern. According to another embodiment, the third pinion 30-P3 of each of the first and second rotation members 30-L and 30-R may be omitted and include the second pinion 30-P2 that contacts the shutter member 20. According to another embodiment, the first pinion 30-P1 of each of the first and second rotation members 30-L and 30-R may be omitted and the first rotation axis 30-RA1 may be connected by a mechanical member, e.g., a motor. In addition, the first and second rotation members 30-L and 30-R may include at least one pinion. In other embodiments, the number of the pinions included in the first and second rotation members 30-L and 30-R may be changed.

The shutter member 20 includes a plurality of side surfaces. Among the side surfaces, two opposite side surfaces facing the second direction D2 and a direction opposite to the second direction D2 contact the third pinions 30-P3 of the first and second rotation members 30-L and 30-R, respectively. The opposite side surfaces facing the second direction D2 and the direction opposite to the second direction D2 may include sawteeth that engage the sawteeth of the third pinions 30-P3.

Due to the engagement between the third pinions 30-P3 and the two side surfaces of the shutter member 20, the position of the shutter member 20 is changed with respect to the base substrate SUB when a motive power is applied to the third pinions 30-P3. According to the change of the position of the shutter member 20, the position of the second opening OP2 is changed with respect to the base substrate SUB. In other embodiments, the sawteeth of the side surfaces, which face the second direction D2 and the direction opposite to the second direction D2, may be omitted.

According to the rotation of the first pinions 30-P1 of the first and second rotation members 30-L and 30-R, the position of the shutter member 20 is changed. When the first pinion 30-P1 of the first rotation member 30-L is rotated in a counter-clockwise direction and the first pinion 30-P1 of the second rotation member 30-R is rotated in a clockwise direction, the shutter member 20 moves in a direction opposite to the first direction D1.

Figure 5A:
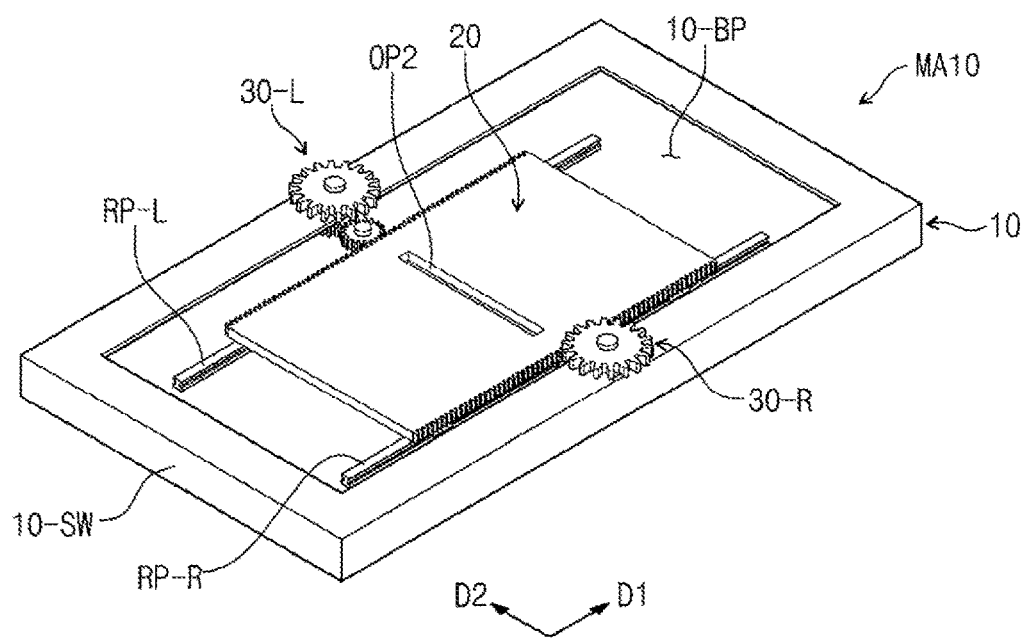
FIG. 5A is a perspective view showing a mask assembly used to test a deposition process according to another exemplary embodiment of the present invention.
Figure 5B:
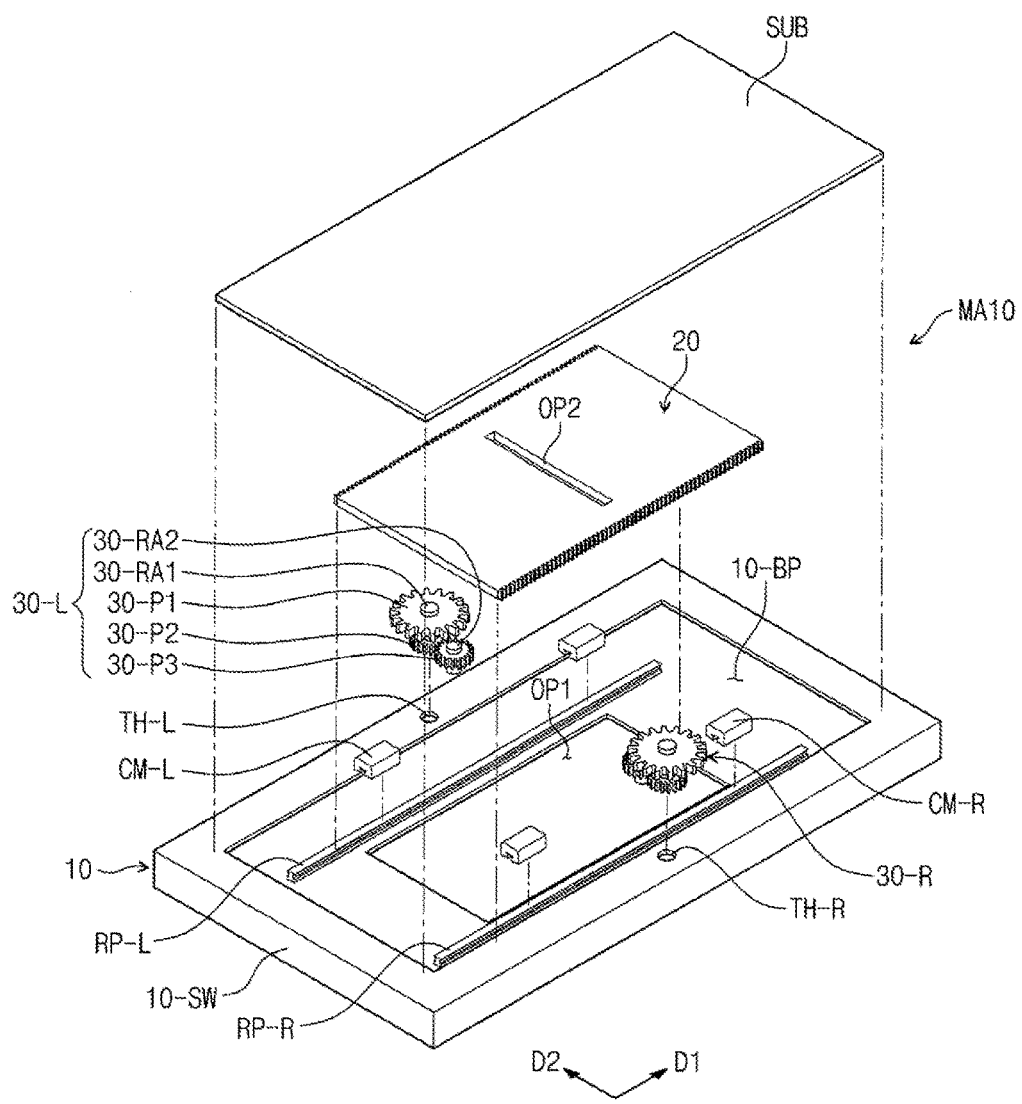
FIG. 5B is an exploded perspective view showing the mask assembly of FIG. 5A.

FIG. 5A is a perspective view showing a mask assembly MA10 used to test a deposition process according to another exemplary embodiment of the present invention. FIG. 5B is an exploded perspective view showing the mask assembly MA10 of FIG. 5A. The mask assembly MA10 shown in FIGS. 5A and 5B has a similar configuration as that of the mask assembly MA described with reference to FIGS. 4A and 4B, and thus detailed descriptions of the same configuration will not be repeated.

Referring to FIGS. 5A and 5B, the mask assembly MA10 further includes first and second rail units RP-L and RP-R spaced apart from each other and disposed on (e.g., located at) the bottom portion 10-BP of the support member 10. The first rail RP-L and the second rail RP-R extend in the first direction D1.

In addition, the mask assembly MA10 includes first and second coupling units (for example, first and second coupling blocks CM-L and CM-R) respectively coupled to the first and second rail units RP-L and RP-L such that the first and second coupling blocks CM-L and CM-R move along the first and second rail units RP-L and RP-R, respectively. FIG. 5B shows two first coupling blocks CM-L and two second coupling blocks CM-R as an example.

The first coupling block CM-L and the second coupling block CM-R are attached to a lower surface of the shutter member 20. Accordingly, the shutter member 20 stably moves by the first and second coupling blocks CM-L and CM-R respectively coupled to the first and second rails RP-L and RP-R. As a result, the shutter member 20 may more firmly couple to or engage the drive member 30.

Figure 6A:
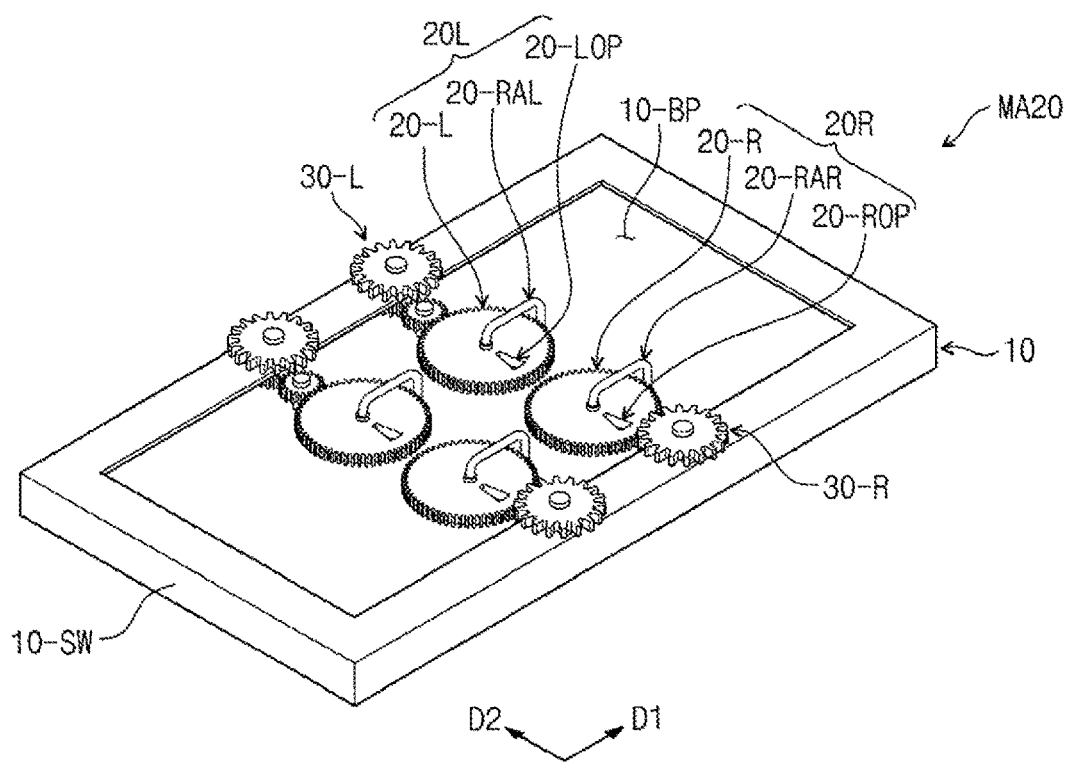
FIG. 6A is a perspective view showing a mask assembly used to test a deposition process according to yet another exemplary embodiment of the present invention.
Figure 6B:
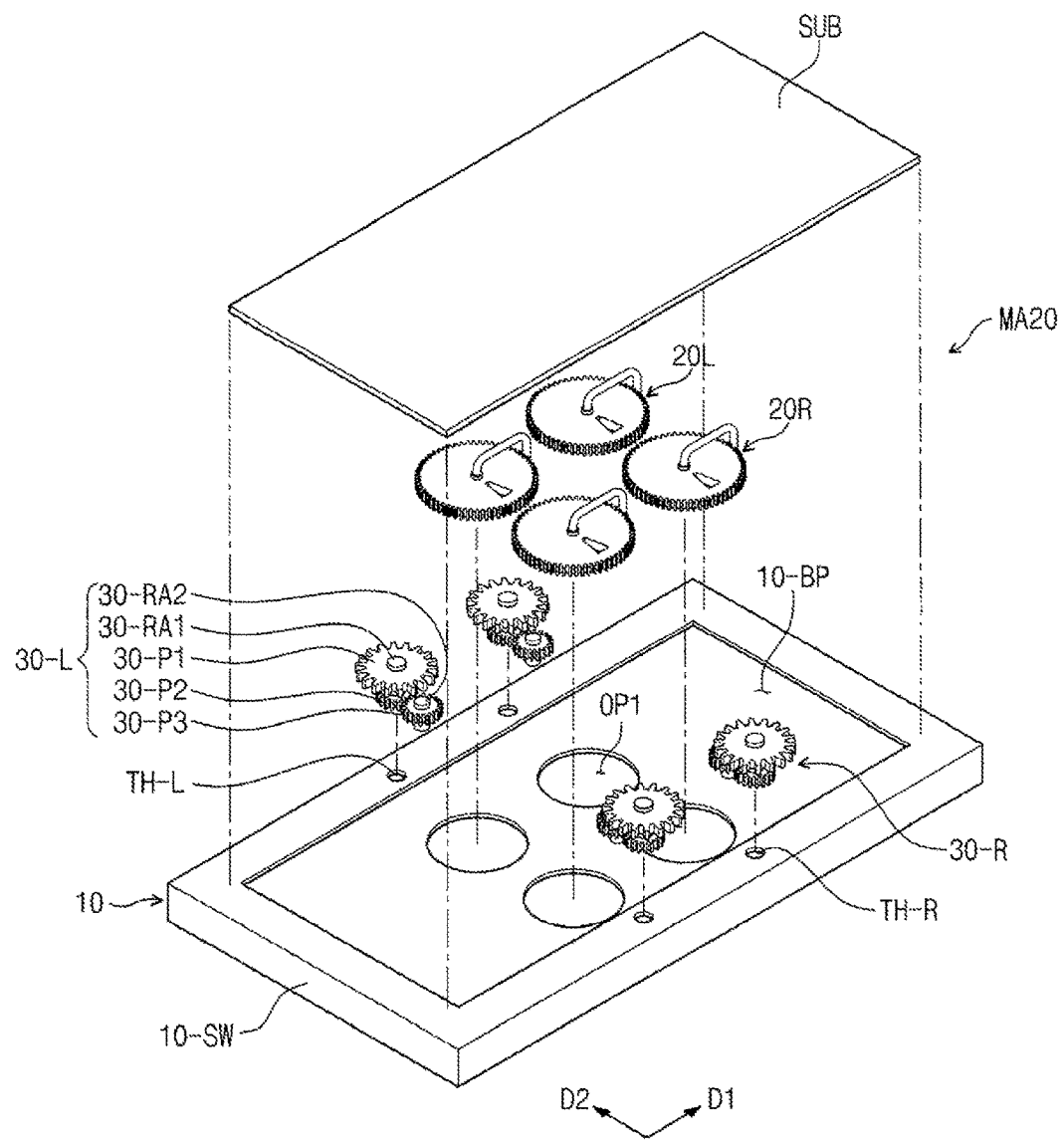
FIG. 6B is an exploded perspective view showing the mask assembly of FIG. 6A.

FIG. 6A is a perspective view showing a mask assembly MA20 used to test a deposition process according to yet another exemplary embodiment of the present invention. FIG. 6B is an exploded perspective view showing the mask assembly MA20 of FIG. 6A. The mask assembly MA20 shown in FIGS. 6A and 6B has a similar configuration as that of the mask assembly MA described with reference to FIGS. 4A and 4B, and thus detailed descriptions of the same configuration will not be repeated.

Referring to FIGS. 6A and 6B, the mask assembly MA20 includes a support member 10, at least one left shutter member 20L and/or right shutter member 20R, and a drive member 30 (see FIG. 3). The support member 10 includes at least one first opening OP1 formed therethrough. As shown in FIG. 6B, the support member 10 includes four first openings OP1.

The mask assembly MA20 includes a plurality of left and right shutter members 20L and 20R. For example, the number of left and right shutter members 20L and 20R may be the same as the number of first openings OP1. That is, four left and right shutter members 20L and 20R are disposed (or located) corresponding to the four first openings OP1, respectively, as shown in FIG. 6B. The four left and right shutter members 20L and 20R include two left shutter members 20L and two right shutter members 20R.

Each of the left shutter members 20L includes a left rotatable member 20-L with a left second opening 20-LOP and a left rotation axis 20-RAL. The left rotation axis 20-RAL is coupled to the left rotatable member 20-L to rotate the left rotatable member 20-L.

Each of the right shutter members 20R includes a right rotatable member 20-R with a right second opening 20-ROP and a right rotation axis 20-RAR. The right rotation axis 20-RAR is coupled to the right rotatable member 20-R to rotate the right rotatable member 20-R. The left rotation axis 20-RAL and the right rotation axis 20-RAR are coupled to the bottom portion 10-BP.

The left rotatable member 20-L and the right rotatable member 20-R are rotated in accordance with the movement of the mask assembly MA20. The left rotatable member 20-L and the right rotatable member 20-R are rotated in opposite directions to each other. In other embodiments, the mask assembly MA20 may include either the left shutter member 20L or the right shutter member 20R.

When the first pinion 30-P1 of the first rotation member 30-L is rotated in the counter-clockwise direction, the left rotatable member 20-L is rotated in the counter-clockwise direction. When the first pinion 30-P1 of the second rotation member 30-R is rotated in the clockwise direction, the right rotatable member 20-R is rotated in the clockwise direction. Due to the rotation of the left rotatable member 20-L, the position of the left second opening 20-LOP is changed with respect to the base substrate SUB. In addition, the position of the right second opening 20-ROP is changed above the base substrate SUB in accordance with the rotation of the right rotatable member 20-R.

Figure 7:
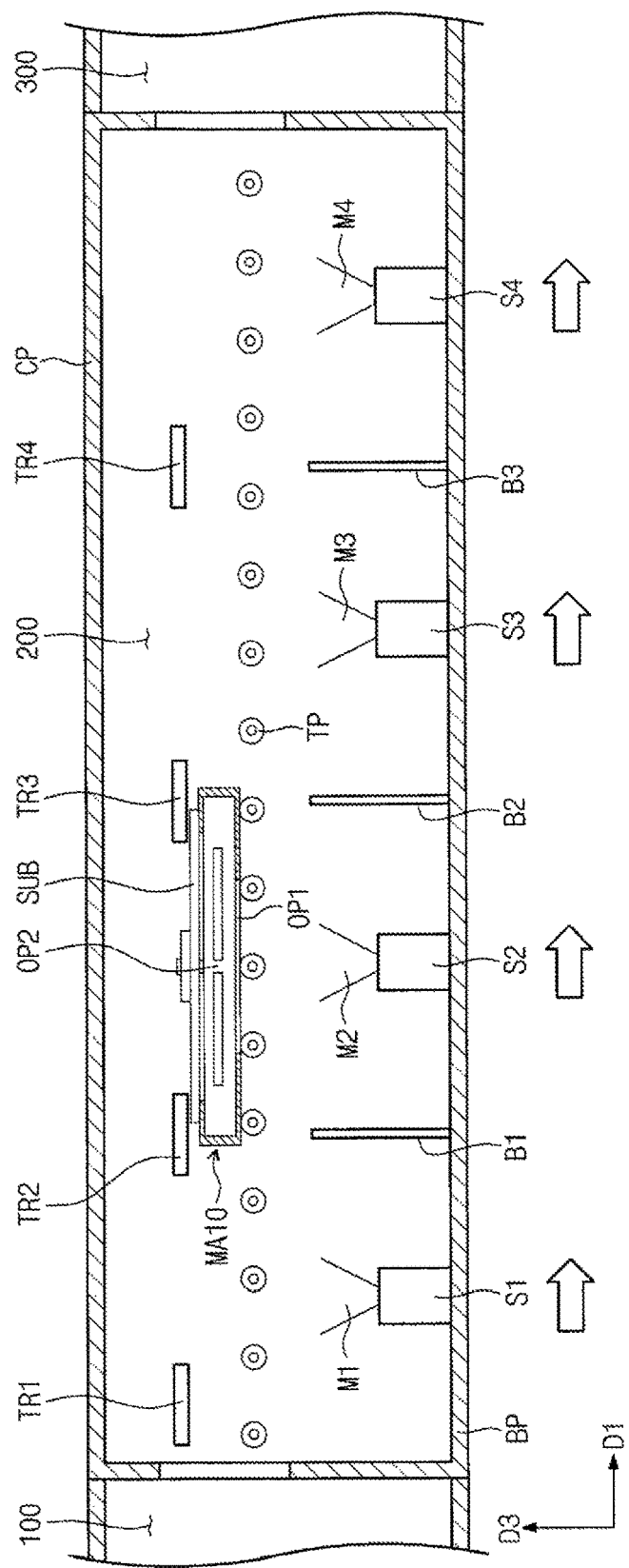
FIG. 7 is a first cross-sectional view showing a portion of the deposition apparatus shown in FIG. 1 according to another exemplary embodiment of the present invention.
Figure 8:
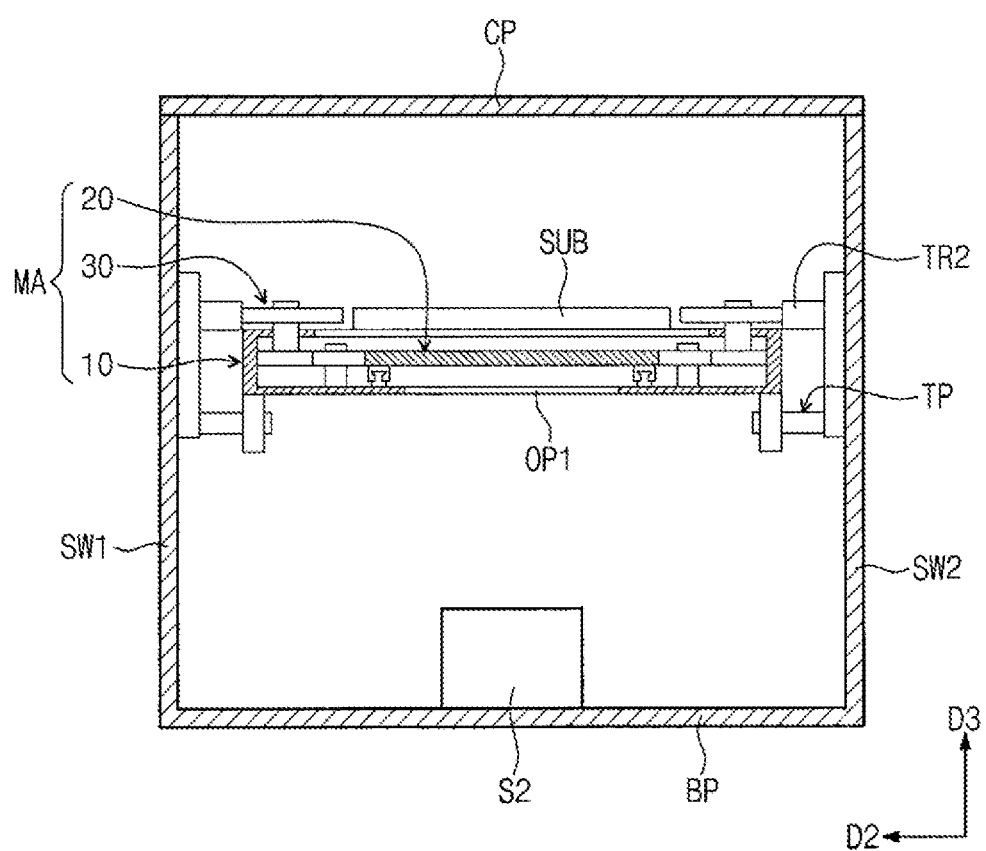
FIG. 8 is a second cross-sectional view showing a portion of the deposition apparatus shown in FIGS. 1 and 7.
Figure 9:
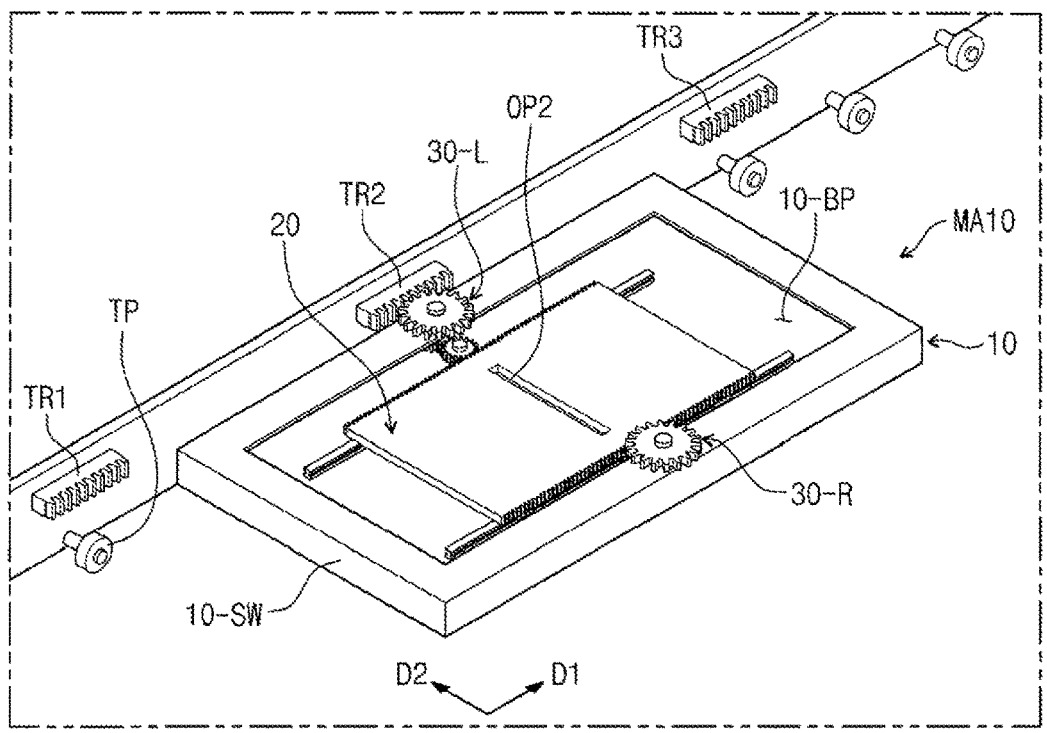
FIG. 9 is a perspective view showing a portion of the deposition apparatus of FIGS. 1 and 7-8 according to an exemplary embodiment of the present invention.

FIG. 7 is a first cross-sectional view showing a portion of the deposition apparatus shown in FIG. 1 according to another exemplary embodiment of the present invention. FIG. 8 is a second cross-sectional view showing a portion of the deposition apparatus shown in FIGS. 1 and 7. FIG. 9 is a perspective view showing a portion of the deposition apparatus of FIGS. 1 and 7-8 according to an exemplary embodiment of the present invention.

In FIGS. 7 to 9, the same reference numerals denote the same elements in FIGS. 1 to 6B, and thus detailed descriptions of the same elements will not be repeated. In addition, FIGS. 7 to 9 show the mask assembly MA10 shown in FIGS. 5A and 5B as an example and the transfer unit TP includes the rollers.

The mask assembly MA10 moves in the first direction D1 by the rollers TP disposed on the first and second sidewalls SW1 and SW2. For example, the support member 10 of the mask assembly MA10 contacts the rollers TP. Accordingly, when the rollers TP stop their operation, the mask assembly MA10 may stop moving.

The mask assembly MA10 may stop moving at each of the individual deposition areas 210 to 240 (see FIG. 1) while the mask assembly MA10 passes through the deposition chamber CB. When the mask assembly MA10 stops moving, the deposition material is deposited on the base substrate SUB. Accordingly, the deposition materials M1 to M4 are deposited in different areas of the base substrate SUB while the mask assembly MA10 passes through the deposition chamber CB.

For example, the mask assembly MA10 may stop moving at the first deposition source S1. In this case, the position of the second opening OP2 with respect to the base substrate SUB is defined as a first position. The first deposition material M1 evaporated from the first deposition source S1 is deposited in an area of the base substrate SUB through the first opening OP1 and the second opening OP2. The mask assembly MA10 that stops moving at the first deposition source S1 for a deposition time period (for example, a predetermined time period) moves again in the first direction D1. In this case, the shutter member 20 moves in the opposite direction to the first direction D1.

The mask assembly MA10 stops moving at the second deposition source S2. The position of the second opening OP2 with respect to the base substrate SUB is defined as a second position. The second position is different from the first position because the second opening OP2 has moved in the opposite direction to the first direction D1 (that is, away from the first position) since the second opening OP2 was in the first position. That is, to reach the second position, the second opening OP2 had to move further in the direction opposite to the first direction D1 than the second opening OP2 moved to reach the first position. Accordingly, the second deposition material M2 evaporated from the second deposition source S2 is deposited through the first opening OP1 and the second opening OP2 in an area of the base substrate SUB that is different from the area in which the first deposition material M1 is deposited.

Then, the mask assembly MA10 stops moving at each of the third and fourth deposition sources S3 and S4. When the mask assembly MA10 completely passes through the deposition area 200 of the deposition chamber CB, the first to fourth deposition materials M1 to M4 are deposited in different areas on the base substrate SUB. After that, the thickness and uniformity of each of the first to fourth deposition materials M1 to M4 deposited on the base substrate SUB are measured. The measured thickness and uniformity are compared to the reference thickness and uniformity values. Accordingly, the deposition process of the deposition chamber CB is tested to see if it is appropriate for manufacturing the display apparatus (or other semiconductor device) according to the compared results.

As shown in FIGS. 7 to 9, the deposition apparatus according to the present exemplary embodiment includes a plurality of transfer racks TR1 to TR4 disposed on each of the first and second sidewalls SW1 and SW2 of the deposition chamber CB. The transfer racks TR1 to TR4 are located in the deposition area 200.

FIGS. 7-9 show the transfer racks TR1 to TR4 disposed on the first sidewall SW1 and the first pinion 30-P1 (see FIG. 5B) of the first rotation member 30-L. The transfer racks TR1 to TR4 are spaced apart from each other. The transfer racks TR1 to TR4 are disposed to correspond to the deposition sources S1 to S4 in a one-to-one correspondence. The transfer racks TR1 to TR4 are disposed closer to the loading area 100 than the deposition sources S1 to S4 in the first direction D1. In another embodiment of the present invention, the transfer racks correspond to the partition walls B1 to B3 (or spaces between the deposition sources S1 to S4) in a one-to-one correspondence. That is, there is no transfer rack before the first deposition source S1.

When the mask assembly MA10 moves in the first direction D1, the first pinion 30-P1 of the first rotation member 30-L sequentially engages the transfer racks TR1 to TR4. For instance, when the first pinion 30-P1 finishes engaging the first transfer rack TR1, the second opening OP2 is located at the first position, and the second opening OP2 is located at the second position when the first pinion 30-P1 finishes engaging the second transfer rack TR2. As shown in FIG. 9, when the first pinion 30-P1 engages the second transfer rack TR2, the shutter member 20 moves with respect to the base substrate SUB in the opposite direction to the first direction D1 by a length corresponding to the length of the second transfer rack TR2.

In another embodiment, the left rotatable member 20-L of the mask assembly MA20 shown in FIGS. 6A and 6B may be rotated in the counter-clockwise direction by the engagement of the first pinion 30-P1 of the first rotation member 30-L and the transfer racks TR1 to TR4 disposed on the first sidewall SW1. In addition, the second rotatable member 20-R may be rotated in the clockwise direction by the engagement of the first pinion 30-P1 of the second rotation member 30-R and the transfer racks TR1 to TR4 disposed on the second sidewall SW2.

Figure 10:
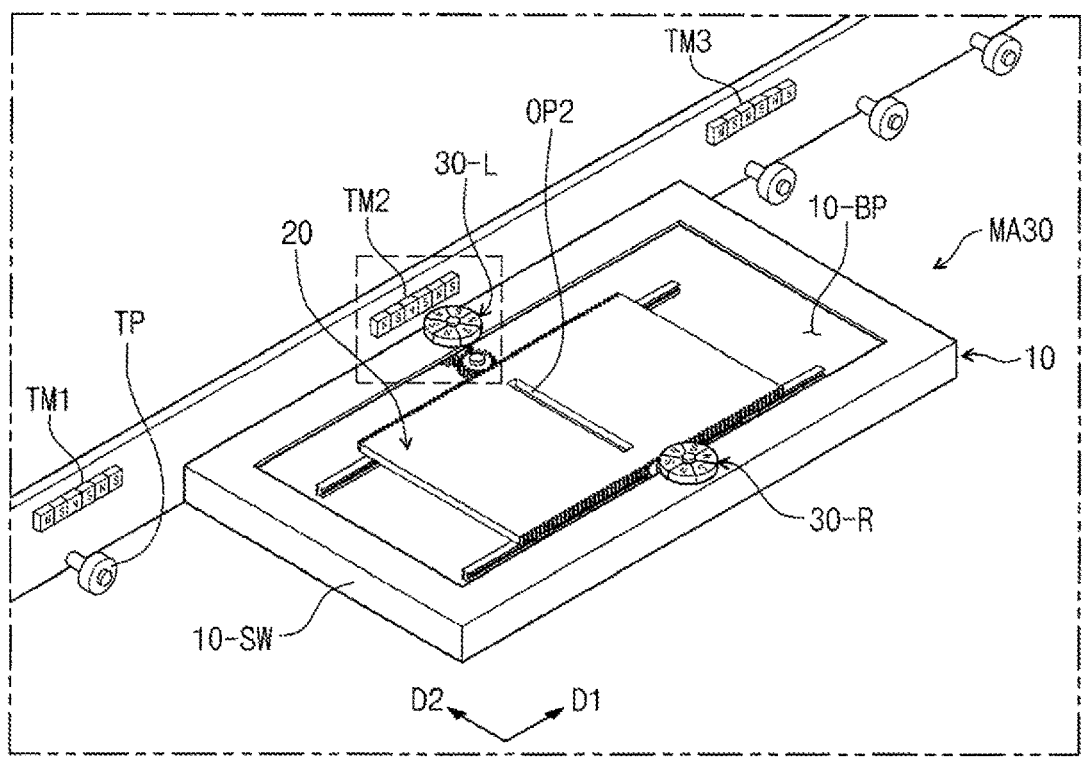
FIG. 10 is a perspective view showing a portion of the deposition apparatus of FIGS. 1 and 7-8 according to another exemplary embodiment of the present invention.
Figure 11:
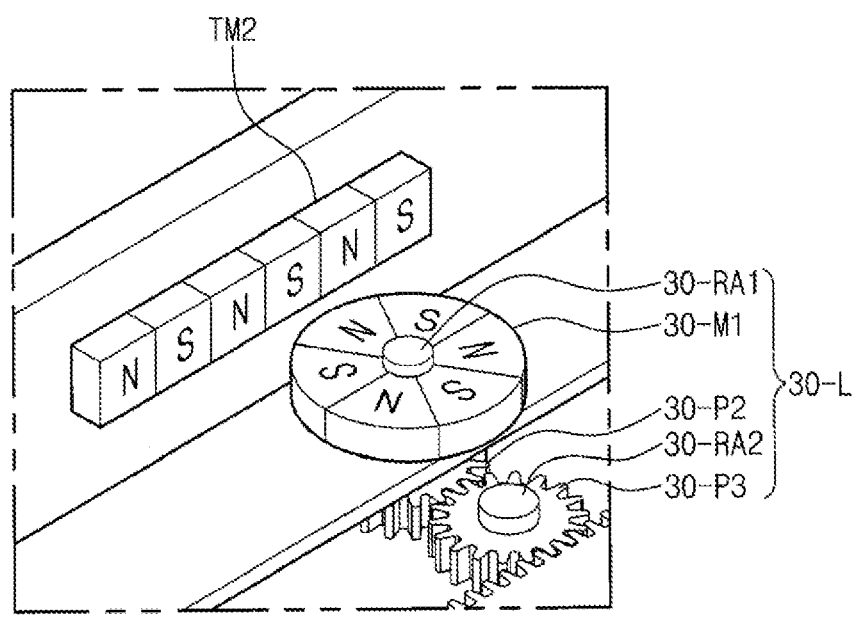
FIG. 11 is an enlarged perspective view showing a portion of the deposition apparatus shown in FIG. 10.

FIG. 10 is a perspective view showing a portion of the deposition apparatus of FIGS. 1 and 7-8 together with a mask assembly MA30 according to another exemplary embodiment of the present invention. FIG. 11 is an enlarged perspective view showing a portion of the deposition apparatus including a portion of the mask assembly MA30 shown in FIG. 10. In FIGS. 10 and 11, the same reference numerals denote the same elements in FIGS. 1 to 9, and thus detailed descriptions of the same elements will not be repeated.

Referring to FIGS. 10 and 11, a deposition apparatus includes a plurality of magnetic transfer members TM1 to TM3 disposed on the sidewalls SW1 and SW2 of the deposition chamber CB. Each of the magnetic transfer members TM1 to TM3 includes N-polar portions and S-polar portions, which are alternately arranged with each other. Each of the magnetic transfer members TM1 to TM3 extends in the first direction D1. The magnetic transfer members TM1 to TM3 are used instead of the transfer racks TR1 to TR4 shown in FIG. 9.

As shown in FIGS. 10 and 11, each of the first and second rotation members 30-L and 30-R of the mask assembly MA30 includes a discus-shaped magnetic member 30-M1. The discus-shaped magnetic member 30-M1 also includes N-polar portions and S-polar portions, which are alternately arranged with each other along its circumference. The first pinion 30-P1 (see FIG. 4B) may thus be replaced with the discus-shaped magnetic member 30-M1.

When the mask assembly MA30 moves in the first direction D1, the discus-shaped magnetic member 30-M1 moves proximate to each of the magnetic transfer members TM1 to TM3. The discus-shaped magnetic member 30-M1 may be spaced apart from the magnetic transfer members TM1 to TM3. The discus-shaped magnetic member 30-M1 is rotated by a magnetic force, e.g., an attractive and/or a repulsive force, between the N-polar portions and the S-polar portions of the discus-shaped magnetic member 30-M1 and the magnetic transfer members TM1 to TM3.

For instance, when the discus-shaped magnetic member 30-M1 passes through the second magnetic transfer member TM2, the shutter member 20 moves in the opposite direction to the first direction D1 by a length corresponding to a length of the second magnetic transfer member TM2. According to the present exemplary embodiment, since friction does not occur between the discus-shaped magnetic member 30-M1 and the magnetic transfer members TM1 to TM3, foreign substances are not generated in the deposition area 200. In other embodiments, the second pinion 30-P2 and the third pinion 30-P3 may also be replaced with the discus-shaped magnetic member.

Figure 12:
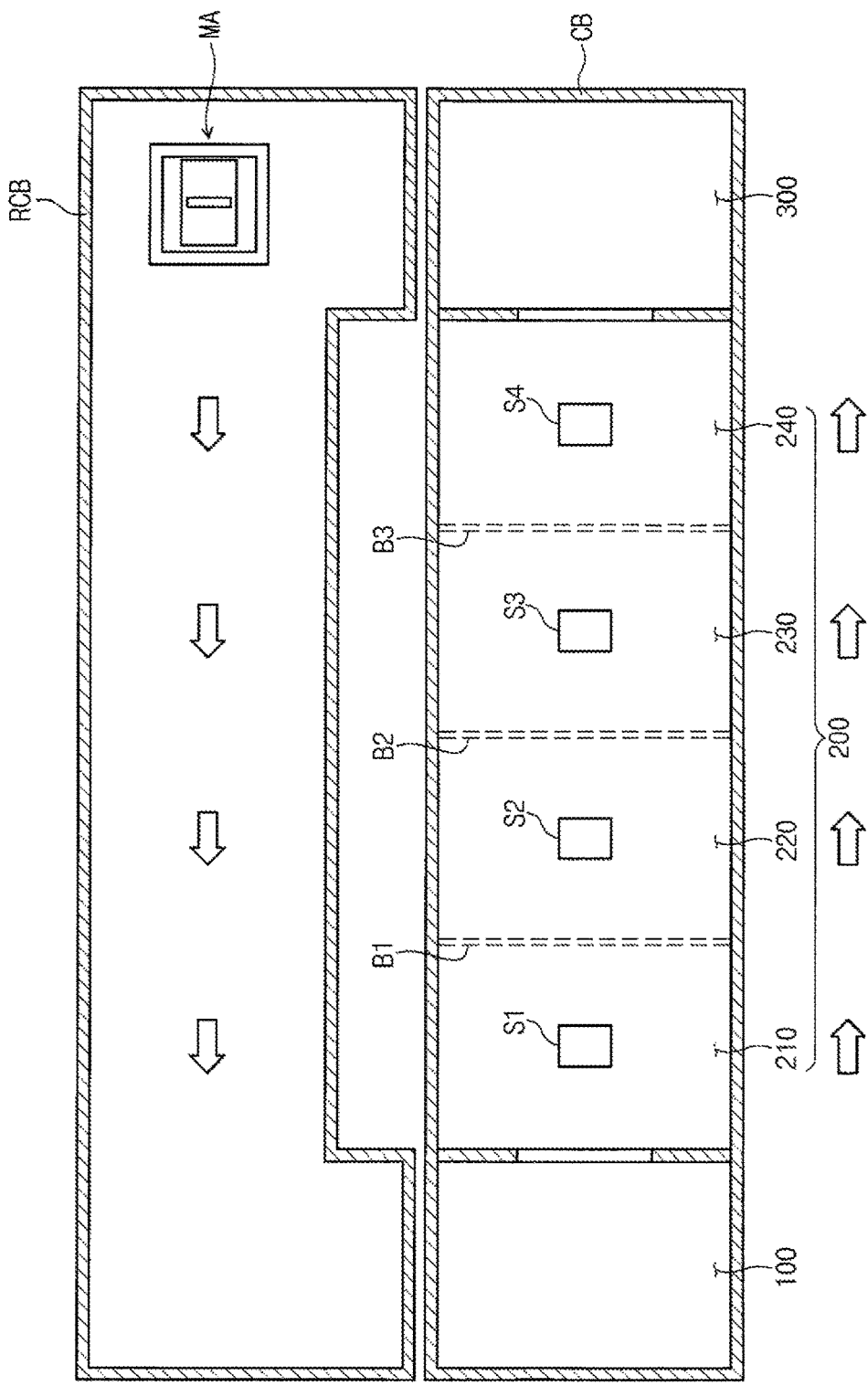
FIG. 12 is a plan view showing a deposition apparatus according to another exemplary embodiment of the present invention.
Figure 13:
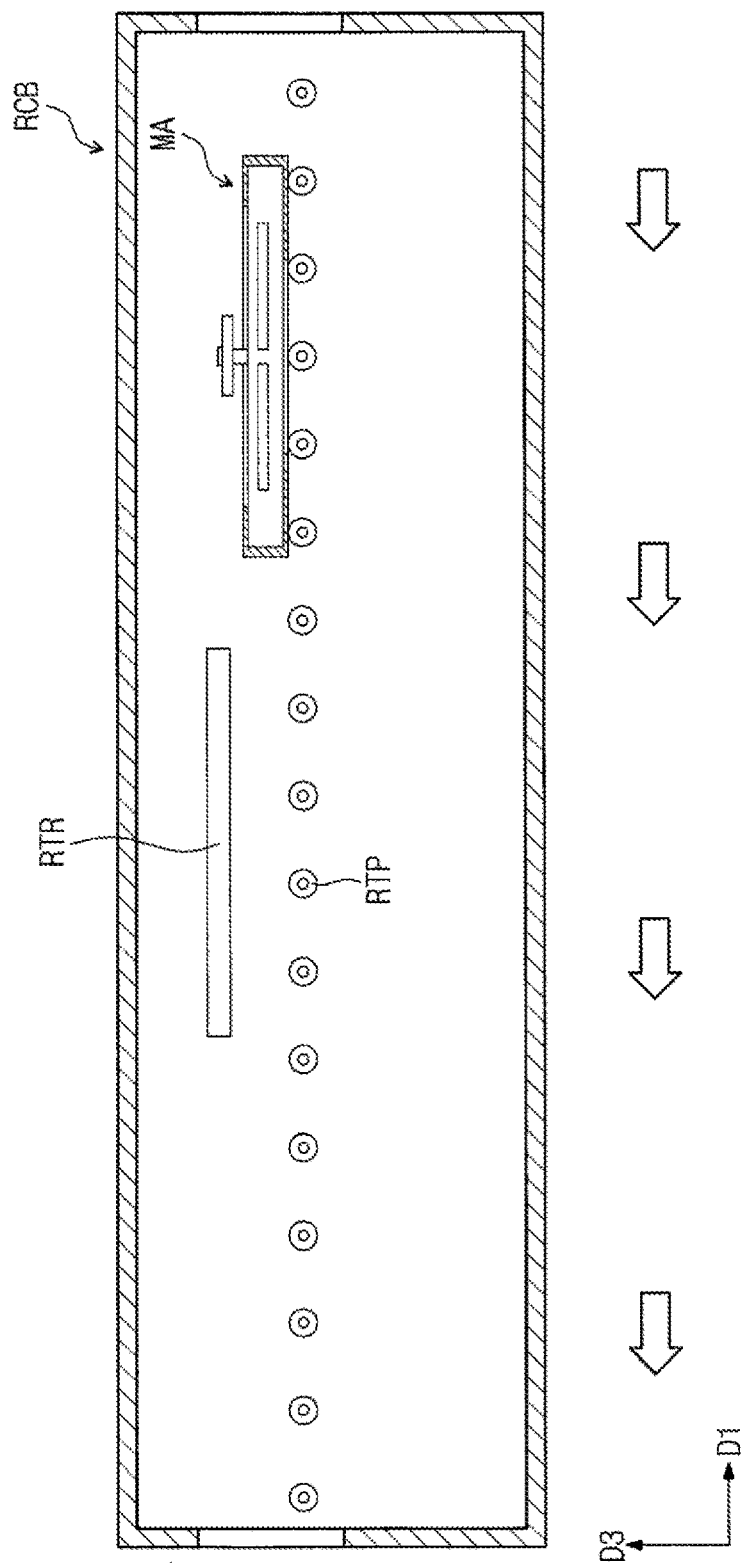
FIG. 13 is a first cross-sectional view showing a portion of the deposition apparatus shown in FIG. 12.
Figure 14:
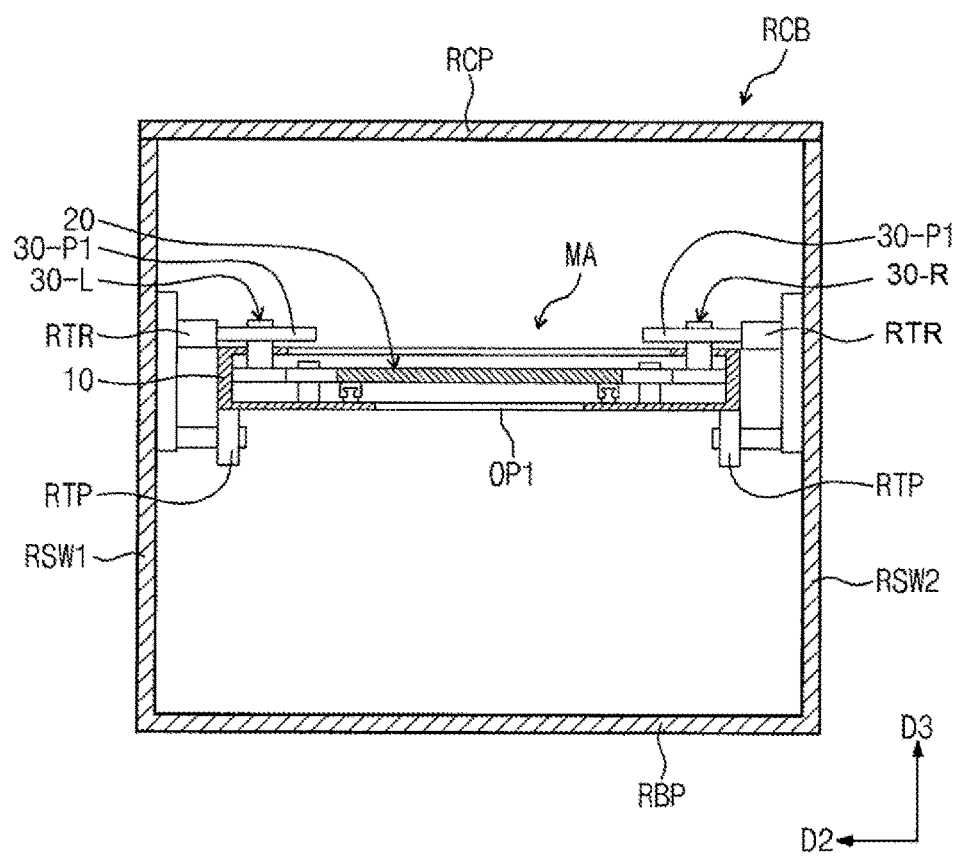
FIG. 14 is a second cross-sectional view showing a portion of the deposition apparatus shown in FIGS. 12-13.

FIG. 12 is a plan view showing a deposition apparatus according to another exemplary embodiment of the present invention. FIG. 13 is a first cross-sectional view showing a portion of the deposition apparatus shown in FIG. 12. FIG. 14 is a second cross-sectional view showing a portion of the deposition apparatus shown in FIGS. 12-13. In FIGS. 12 to 14, the same reference numerals denote the same elements in FIGS. 1 to 11, and thus detailed descriptions of the same elements will not be repeated.

Referring to FIGS. 12 to 14, the deposition apparatus includes a deposition chamber CB, a plurality of deposition sources S1 to S4, a mask assembly MA, and a transfer unit TP (see FIG. 2). The deposition apparatus further includes a return chamber RCB and a return unit RTP. The return unit RTP is disposed in the return chamber RCB to return the mask assembly MA to the loading area 100 from the unloading area 300. The return unit RTP may be configured, for example, to include a conveyor belt or a set of rollers (or some other transfer device) as with the transfer unit TP. The return unit RTP moves the mask assembly MA from which the base substrate SUB (see FIG. 3) is separated or decoupled.

The return chamber RCB includes a first sidewall RSW1, a second sidewall RSW2 facing the first sidewall RSW1 in the second direction D2, a bottom portion RBP, and a ceiling portion RCP. The return unit RTP may be disposed on the first sidewall RSW1 and the second sidewall RSW2.

The return chamber RCB may further include a return rack RTR disposed on at least one of the first or second sidewalls RSW1 or RSW2 of the return chamber RCB. The return rack RTR may also be disposed on each of the first and second sidewalls RSW1 and RSW2.

The mask assembly MA enters (for example, is coupled to or put under the control of) the return unit RTP at an opposite end of the deposition chamber CB (for example, corresponding to the unloading area 300) to where the mask assembly MA entered (for example, was coupled to or put under the control of) the transfer unit TP (for example, corresponding to the loading area 100). In order to return the position of the shutter member 20 to the position before the mask assembly MA entered the transfer unit TP, each of the return racks RTR may have a length equal to a sum of the lengths of the transfer racks TR1 to TR4. When the mask assembly MA moves in the opposite direction to the first direction D1, the pinions 30-P1 and 30-P2 (see FIG. 4B) of the drive member 30 (for example, first rotation member 30-L or second rotation member 30-R) respectively engage the return racks RTR disposed on the first and second sidewalls RSW1 and RSW2.

When the mask assembly MA completely passes through the return rack RTR, the shutter member 20 moves in the first direction D1 with respect to the mask assembly MA by a length corresponding to the length of the return rack RTR. That is, the position of the shutter member 20 completely passing through the return rack RTR returns to its original position before the mask assembly MA entered the transfer unit TP.

According to another embodiment, when each of the first and second rotation members 30-L and 30-R includes the discus-shaped magnetic member 30-M1 (refer to FIGS. 10 and 11), the return rack RTR may be replaced with a magnetic return member, in which N-polar portions and S-polar portions are alternately arranged with each other.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed in the accompanying claims, and their equivalents.

What is claimed is:

1. A mask assembly comprising:
   a support member having a first opening configured to allow deposition materials to pass through, the support member being configured to support a base substrate on which a portion of the passed-through deposition materials are deposited;
   a shutter member accommodated in the support member, the shutter member having a second opening smaller than the first opening and configured to allow the portion of the passed-through deposition materials to pass through and deposit on the base substrate; and
   a drive member including a plurality of pinions,
   wherein a first pinion of the plurality of pinions contacts a side surface of the shutter member and wherein a second pinion of the plurality of pinions is coupled to the first pinion and is configured to engage with one of a plurality of transfer racks on a chamber wall, to change a position of the second opening with respect to the base substrate.

2. The mask assembly of claim 1, wherein the support member comprises:
   a bottom portion having the first opening; and
   a sidewall bent from the bottom portion to support the base substrate.

3. The mask assembly of claim 2, wherein the second opening is configured to move with respect to the base substrate in a direction opposite to a first direction in accordance with the movement of the mask assembly.

4. The mask assembly of claim 3, wherein the second opening extends in a second direction substantially perpendicular to the first direction.

5. The mask assembly of claim 2, wherein the shutter member has a larger area than the first opening and is located on the bottom portion.

6. The mask assembly of claim 2, further comprising:
   a rail unit located on the bottom portion; and
   a coupling unit coupled to the shutter member and inserted into the rail unit to allow the shutter member to move along the rail unit.

7. The mask assembly of claim 1, wherein the shutter member comprises sawteeth on the side surface of the shutter member and configured to engage with sawteeth of the first pinion.

\* \* \* \* \*